United States Patent
Onomitsu et al.

(10) Patent No.: US 12,049,711 B2
(45) Date of Patent: Jul. 30, 2024

(54) METHOD FOR PRODUCING A MECHANICAL VIBRATOR COMPRISING EPITAXIALLY GROWING A CUBIC CRYSTAL ON A MATERIAL LAYER TO FORM A LAMINATE STRUCTURE WHICH IS PATTERNED TO FORM A VIBRATOR SHAPE PART

(71) Applicant: Nippon Telegraph and Telephone Corporation, Tokyo (JP)

(72) Inventors: Koji Onomitsu, Tokyo (JP); Kazuyuki Hirama, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 751 days.

(21) Appl. No.: 16/973,706

(22) PCT Filed: May 20, 2019

(86) PCT No.: PCT/JP2019/019896
§ 371 (c)(1),
(2) Date: Dec. 9, 2020

(87) PCT Pub. No.: WO2019/239803
PCT Pub. Date: Dec. 19, 2019

(65) Prior Publication Data
US 2021/0207286 A1    Jul. 8, 2021

(30) Foreign Application Priority Data
Jun. 11, 2018  (JP) .................. 2018-110928

(51) Int. Cl.
*C30B 23/02*  (2006.01)
*C23C 16/27*  (2006.01)
(Continued)

(52) U.S. Cl.
CPC .............. *C30B 29/68* (2013.01); *C23C 16/27* (2013.01); *C23C 16/342* (2013.01);
(Continued)

(58) Field of Classification Search
CPC ....... C30B 23/00; C30B 23/02; C30B 23/025; C30B 23/04; C30B 25/00; C30B 25/02;
(Continued)

(56) References Cited

U.S. PATENT DOCUMENTS 5,298,286 A  *  3/1994  Yang ................... C23C 16/0272
                                                      427/372.2
2008/0003447 A1* 1/2008  Nee ........................ C30B 25/18
                                                         428/615

FOREIGN PATENT DOCUMENTS

CN            204958378 U   *  1/2016

OTHER PUBLICATIONS

Mochimaru—ISR D2+IDS—Fab of CVD diamond resonators—Proc. 16th Inter'l.Conf. Nano.—2016 (Year: 2016).*
(Continued)

*Primary Examiner* — Kenneth A Bratland, Jr.
(74) *Attorney, Agent, or Firm* — Slater Matsil, LLP

(57) ABSTRACT

A material composed of an element having no catalytic action is epitaxially grown on a nickel layer to form a material layer. For example, iridium is epitaxially grown to form the material layer. Next, a cubic crystal is epitaxially grown on the material layer to form a crystal layer, and a laminate structure including the material layer and the crystal layer is patterned to form a vibrator shape part. The thickness of the material layer is controlled within a range in which lattice relaxation is not complete.

20 Claims, 8 Drawing Sheets

(51) Int. Cl.
*C23C 16/34* (2006.01)
*C30B 25/18* (2006.01)
*C30B 29/04* (2006.01)
*C30B 29/40* (2006.01)
*C30B 29/68* (2006.01)
*C30B 33/10* (2006.01)

(52) U.S. Cl.
CPC .......... *C30B 23/025* (2013.01); *C30B 25/183* (2013.01); *C30B 29/04* (2013.01); *C30B 29/403* (2013.01); *C30B 33/10* (2013.01)

(58) Field of Classification Search
CPC ....... C30B 25/04; C30B 25/18; C30B 25/183; C30B 25/186; C30B 29/00; C30B 29/02; C30B 29/04; C30B 29/40; C30B 29/403; C30B 29/406; C30B 29/60; C30B 29/68; C30B 33/08; C30B 33/10; C23C 16/27; C23C 16/342
USPC ........ 117/84, 88, 94–95, 101–102, 105–106, 117/928–929, 952
See application file for complete search history.

(56) References Cited

OTHER PUBLICATIONS

Mochimaru, et al. publication entitled "Fabrication and evaluation of CVD diamond resonators," Proceedings of the 16th International Conference on Nanotechnology, Sendai, Japan, pp. 676-677, Aug. 22-25, 2016. (Year: 2016).*

A website entitled "Lattice Constants of the Elements," available at https://periodictable.com/Properties/A/LatticeConstants.html which was accessed on Oct. 10, 2023. (Year: 2023).*

Mochimaru, Y., et al., "Fabrication and evaluation of CVD diamondresonators" Proceedings of the 16th International Conference on Nanotechnology, IEEE, Aug. 25, 2016, pp. 676-677.

Shibata, T., et al., "Micromachining of Diamond Film for MEMS Applications," Journal of Microelectromechanical Systems, Mar. 2000, pp. 47-51, vol. 9, No. 1.

* cited by examiner

METHOD FOR PRODUCING A MECHANICAL VIBRATOR COMPRISING EPITAXIALLY GROWING A CUBIC CRYSTAL ON A MATERIAL LAYER TO FORM A LAMINATE STRUCTURE WHICH IS PATTERNED TO FORM A VIBRATOR SHAPE PART

This patent application is a national phase filing under section 371 of PCT/JP2019/019896, filed May 20, 2019, which claims the priority of Japanese patent application number 2018-110928, filed Jun. 11, 2018, each of which is incorporated herein by reference in its entirety.

TECHNICAL FIELD

The present invention relates to a mechanical vibrator composed of a cubic crystal made of diamond or cubic boron nitride and a method of producing the same.

BACKGROUND

Diamond, which has a very high Young's modulus, can operate as a mechanical vibrator at a very high frequency. When diamond is used for a vibrating part of a mechanical vibrator, a diamond layer is formed on a layer that can be selectively removed by etching, a part of a substrate below the diamond layer is removed, and thus a beam structure is formed. For example, after etching is performed by physical dry etching while a substrate is tilted by a focused ion beam (FIB) or reactive ion etching (RIE), the substrate is tilted to the opposite side and the same etching is performed again, and thus openings formed by etching from both sides are connected to produce a beam structure, which is possible in principle.

However, in this case, a mask that protects a part of an area is used on the diamond layer. Of course, since diamond itself is very stable, the etching rate is low, the mask is largely etched during an etching process, and even if it is realized, there is a limit to the processing size and processing accuracy.

On the other hand, a technology in which a diamond mechanical vibrator is formed using diamond grown by CVD on a Si substrate including a $SiO_2$ layer has been proposed (refer to Non Patent Literature 1). In this technology, the $SiO_2$ layer is selectively wet-etched with a hydrofluoric acid aqueous solution or buffer hydrofluoric acid aqueous solution, and thus it is possible to produce a cross-linked structure or a cantilever beam structure. However, it is known that a difference in lattice constant between Si and diamond is 50% or more, and it is difficult for a crystal of high-quality diamond to grow on Si.

In recent years, a diamond thin film has been grown on iridium (refer to Non Patent Literature 2). Although iridium is chemically stable and etching is possible with hydrofluoric acid at high temperature, it cannot be said that selective etching can be easily performed. In addition, there is a lattice mismatch of 7% or more between iridium and diamond, and the quality is not as good as homoepitaxial. When the crystallinity of an area that vibrates is lower, an energy dissipation amount is larger, and it is not possible to obtain a Q value that should be obtained. When the Q value is higher, operation is possible with lower energy, and when used as a sensor or the like, the sensitivity becomes higher. Therefore, it is desirable to use a high-quality crystal having favorable crystallinity for the mechanical vibrator.

PRIOR ART

Non Patent Literature

[NPL 1] T. Shibata et al., "Micromachining of Diamond Film for MEMS Applications," Journal of Microelectromechanical Systems, vol. 9, no. 1, pp. 47-51, 2000.

[NPL 2] Kazuhiro Suzuki, Atsuhito Sawabe, "Heteroepitaxial growth of diamond," Proceedings of the 59th Spring Meeting, the Japan Society of Applied Physics, 15p-F5-2, 244 p, 2012.

[NPL 3] K. Hirama et al., "Heteroepitaxial growth of single-domain cubic boron nitride films by ion-beam-assisted MBE," Applied Physics Express, vol. 10, 035501, 2017.

[NPL 4] H. Yamaguchi et al., "Improved resonance characteristics of GaAs beam resonators by epitaxially induced strain," Applied Physics Letters, vol. 92, no. 251913, 2008.

SUMMARY

Technical Problem

As described above, it is possible to construct a mechanical vibrator that operates at a high frequency using a crystal such as diamond, but there are problems that it is not easy to form a vibrator structure in a favorable crystallinity state, and it is not easy to obtain a high Q value that should be originally obtained from a high Young's modulus of the crystal.

Embodiments of the present invention have been made in order to solve the above problems, and an object of embodiments of the present invention is to obtain a high Q value in a mechanical vibrator made of a cubic crystal such as diamond.

Means for Solving the Problem

A method of producing a mechanical vibrator according to embodiments of the present invention includes a first step in which a material composed of an element having no catalytic action is epitaxially grown on a nickel layer made of a nickel crystal to form a material layer; a second step in which a cubic crystal is epitaxially grown on the material layer to form a crystal layer; a third step in which a laminate structure including the material layer and the crystal layer is patterned to form a vibrator shape part; and a fourth step in which the nickel layer below the vibrator shape part is removed to form a vibrator including the vibrator shape part.

In the method of producing a mechanical vibrator, in the first step, the material layer having a thickness of 10 nm or less may be formed.

In the method of producing a mechanical vibrator, a crystal constituting the crystal layer may be diamond or cubic boron nitride.

In the method of producing a mechanical vibrator, in the second step, a crystal made of diamond or cubic boron nitride is epitaxially grown on the material layer to form the crystal layer. The method of producing a mechanical vibrator may further include a fifth step in which a crystal made of cubic boron nitride or diamond is epitaxially grown on the crystal layer to form another crystal layer and, in the third step, a laminate structure including the material layer, the crystal layer, and the other crystal layer may be patterned to form the vibrator shape part.

In the method of producing a mechanical vibrator, the material composed of an element having no catalytic action may be iridium or platinum.

A mechanical vibrator according to embodiments of the present invention has a laminate structure including a material layer made of a material composed of an element having no catalytic action and a crystal layer made of a cubic crystal formed on the material layer, wherein lattice constants in a plane direction are equal at an interface between the material layer and the crystal layer.

In the mechanical vibrator, a crystal constituting the crystal layer may be diamond or cubic boron nitride.

The mechanical vibrator may include another crystal layer made of cubic boron nitride or diamond on the crystal layer, and the laminate structure may include the material layer, the crystal layer, and the other crystal layer.

In the mechanical vibrator, a material composed of an element having no catalytic action may be iridium or platinum.

Effects of Embodiments of the Invention

As described above, according to embodiments of the present invention, a material composed of an element having no catalytic action is epitaxially grown on a nickel layer made of a nickel crystal to form a material layer, and a cubic crystal is epitaxially grown thereon to form a crystal layer, and thus an excellent effect of forming a mechanical vibrator made of a cubic crystal such as diamond and having a high Q value is obtained.

DETAILED DESCRIPTION OF ILLUSTRATIVE EMBODIMENTS

A method of producing a mechanical vibrator according to an embodiment of the present invention will be described below with reference to FIG. 1A to FIG. 1H.

Figure 1A:
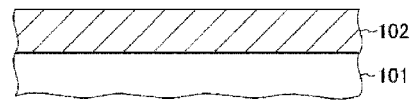
FIG. 1A is a cross-sectional view showing a status of an intermediate process for explaining a method of producing a mechanical vibrator according to an embodiment of the present invention.

First, as shown in FIG. 1A, a nickel layer 102 made of a nickel crystal (single crystal) is formed on a substrate 101. For example, nickel is grown to a thickness of 200 nm on the substrate 101 made of MgO to sufficiently relax its lattice. The plane orientation of the substrate 101 may not be specified. The substrate 101 may be a sapphire substrate, a nitride substrate, a SiC substrate, or a metal substrate (may be a nickel substrate or another metal substrate) as long as it has a single crystal. However, the substrate 101 needs to be a material that can withstand a crystal growth temperature of cubic boron nitride or diamond (about 1,100° C.) as an ultimate goal.

For example, a substrate temperature condition may be about 250° C. to 450° C., and the nickel may be grown in a vacuum. The nickel may be formed by an electron beam evaporation method, a sputtering method, a molecular beam epitaxy method, an evaporation method using a nickel filament, or the like. Here, an optimal substrate temperature condition is slightly different depending on a growth rate and a growth method. After the nickel is grown, the substrate 101 is heated to about 1,000° C. in hydrogen or under a vacuum in an atmosphere of a hydrogen partial pressure of 5 Torr or more, and thus the crystallinity of the nickel is improved.

Figure 1B:
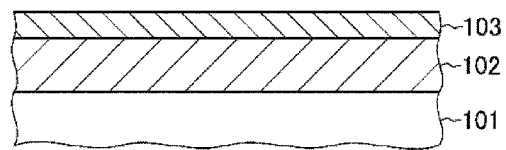
FIG. 1B is a cross-sectional view showing a status of an intermediate process for explaining the method of producing a mechanical vibrator according to the embodiment of the present invention.

Next, as shown in FIG. 1B, a material composed of an element having no catalytic action is epitaxially grown on the nickel layer 102 to form a material layer 103 (first step). For example, iridium is epitaxially grown to form the material layer 103. Hereinafter, iridium will be exemplified as the element having no catalytic action. In this case, for example, the material layer 103 having a thickness of one atomic layer (0.3839 nm) or more and 10 nm or less may be formed on the sufficiently lattice-relaxed nickel layer 102. In addition, for example, the material layer 103 may be formed to have a thickness of more than 1 nm and the upper part in the thickness direction may be lattice-relaxed. Here, a thickness of 1 nm is a critical film thickness at which iridium does not cause lattice relaxation. Here, the critical film thickness varies depending on materials and conditions. Here, a substrate made of single crystal nickel may be used as the nickel layer 102 without using the substrate 101.

A lattice constant (in-plane lattice constant) of the material layer 103 with a thickness of one atomic layer in the plane direction is equal to a lattice constant of nickel (the nickel layer 102) and strain is applied to the material layer 103. When the thickness is thicker than a triatomic layer, the upper part of the material layer 103 is gradually lattice-relaxed, and the material layer 103 approaches the original lattice constant of iridium. Therefore, when the thickness of the material layer 103 is controlled within a range in which lattice relaxation is not complete, the material layer 103 whose front side (upper side) is moderately lattice-relaxed can be formed. The state of lattice relaxation depends on the thickness.

For example, the iridium is grown by an electron beam evaporation method, a sputtering method, a molecular beam epitaxy method or the like and thus the material layer 103 may be formed. According to the molecular beam epitaxy method using a Knudsen cell at high temperature, although the growth rate is slow, the material layer 103 made of iridium having high quality is obtained.

As described above, the material layer 103 formed of iridium that is epitaxially grown on the nickel layer 102 made of single crystal nickel contains in-plane compressive strain and the in-plane lattice constant is equal to that of nickel. The material layer 103 may be formed by depositing one atomic layer, but industrially, deposition of three or more layers is stable because the surface of the nickel layer 102 is completely covered.

Figure 1C:
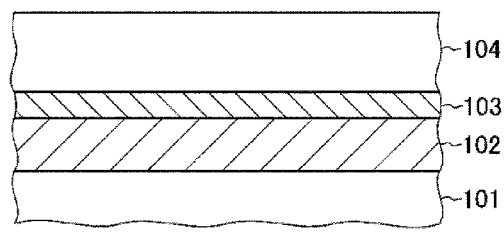
FIG. 1C is a cross-sectional view showing a status of an intermediate process for explaining the method of producing a mechanical vibrator according to the embodiment of the present invention.

Next, as shown in FIG. 1C, a cubic crystal is epitaxially grown on the material layer 103 to form a crystal layer 104 (second step). The crystal constituting the crystal layer 104 is diamond or cubic boron nitride. As described above, when the crystal layer 104 is formed on the material layer 103 having a thickness of one atomic layer, the in-plane lattice constant of the material layer 103 is equal to the lattice constant of the nickel layer 102. When the crystal layer 104 is epitaxially grown on the material layer 103 in this state, it is formed in the same manner as when it is directly epitaxially grown on the nickel layer 102, and has favorable crystallinity. In other words, the crystal layer 104 can be formed while lattice mismatch with the material layer 103 is eliminated.

In addition, when the crystal layer 104 is formed on the material layer 103 which is thicker than one atomic layer within a range in which lattice relaxation is not complete, the in-plane lattice constant of the material layer 103 is slightly different from the lattice constant of the nickel layer 102. In this case, the in-plane lattice constant of the crystal layer 104 is different from that of the nickel layer 102 and strain is applied to the crystal layer 104. As described above, when the crystal layer 104 made of cubic boron nitride or diamond is epitaxially grown on the material layer 103 that is moderately lattice-relaxed, the strain applied to the crystal layer 104 made of the cubic boron nitride or diamond can be controlled from compressive strain to tensile strain.

Figure 1D:
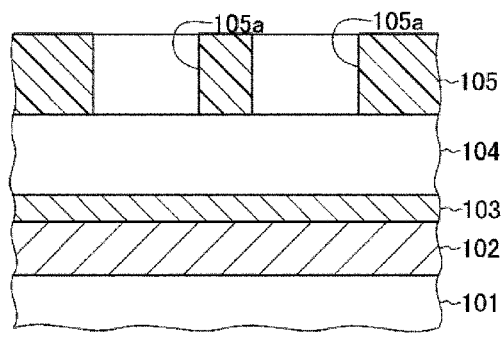
FIG. 1D is a cross-sectional view showing a status of an intermediate process for explaining the method of producing a mechanical vibrator according to the embodiment of the present invention.

Next, as shown in FIG. 1D, a mask pattern 105 having a desired vibrator shape is formed on the crystal layer 104. For example, the mask pattern 105 has two openings 105a that are disposed at a predetermined interval. The mask pattern 105 may be formed according to a known lithography technology. The mask pattern 105 may be made of any material, but the thickness of the mask pattern 105 is determined according to a difference in an etching rate from the crystal layer 104 to be processed and the thickness of the crystal layer 104.

Figure 1E:
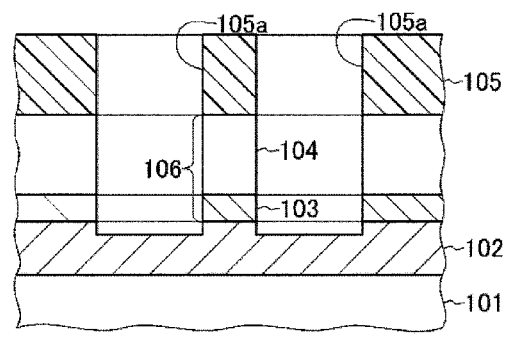
FIG. 1E is a cross-sectional view showing a status of an intermediate process for explaining the method of producing a mechanical vibrator according to the embodiment of the present invention.

Next, as shown in FIG. 1E, according to an etching process using the mask pattern 105 as a mask, a vibrator shape part 106 in which a laminate structure including the material layer 103 and the crystal layer 104 is patterned is formed (third step). For example, according to FIB using Ga ions or RIE using a mixed gas of oxygen and argon, dry etching is physically performed to a depth that reaches the nickel layer 102 through the two openings 105a.

Figure 1F:
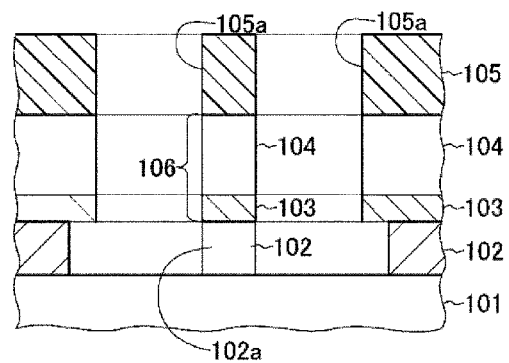
FIG. 1F is a cross-sectional view showing a status of an intermediate process for explaining the method of producing a mechanical vibrator according to the embodiment of the present invention.
Figure 1G:
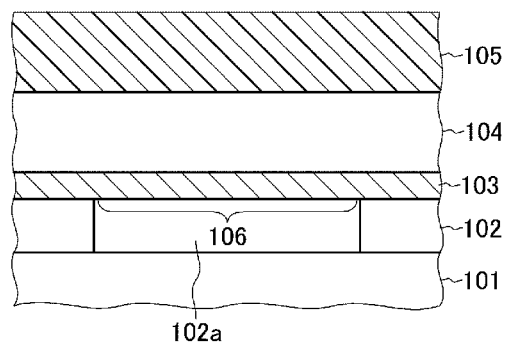
FIG. 1G is a cross-sectional view showing a configuration of a mechanical vibrator according to an embodiment of the present invention.

Next, as shown in FIG. 1F and FIG. 1G, a part of the nickel layer 102 below the vibrator shape part 106 is removed, and a vibrator including the vibrator shape part 106 is formed (fourth step). FIG. 1G shows a cross section between the two openings 105a in directions that differ from each other by 90° from FIG. 1F. For example, the nickel layer 102 may be etched a predetermined amount according to wet etching in which the nickel is selectively etched using the vibrator shape part 106 already formed as a mask.

For example, a vibrator can be formed by selectively etching the nickel layer 102 through the two openings 105a using a hydrochloric acid aqueous solution or a dilute nitric acid aqueous solution. In this etching, in an area between the two openings 105a, the nickel layer 102 below the material layer 103 is etched from both sides and a space iota is formed below the material layer 103. Therefore, in an area between the two openings 105a, the vibrator shape part 106 having a double-supported beam structure separated from the surface of the substrate 101 by the space iota can be formed. The vibrator shape part 106 is designated by the nickel layer 102 on both sides of the space iota in the horizontal direction of the paper in FIG. 1G.

Here, depending on the material of the substrate 101, the substrate itself is etched to a certain thickness from the back surface of the substrate 101 and the side surface of the substrate 101, but this does not affect characteristics of the vibrator itself.

Figure 1H:
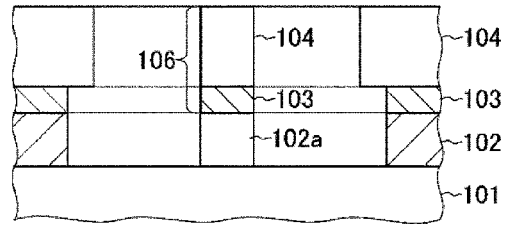
FIG. 1H is a cross-sectional view showing a configuration of the mechanical vibrator according to the embodiment of the present invention.

As described above, after the vibrator shape part 106 is formed, when the mask pattern 105 is removed, as shown in FIG. 1H, a mechanical vibrator having a laminate structure including the material layer 103 made of an iridium crystal and the crystal layer 104 made of a cubic crystal formed on the material layer 103 is obtained. In the mechanical vibrator, the lattice constants in the plane direction are equal at an interface between the material layer 103 and the crystal layer 104. When the thickness of the material layer 103 is one atomic layer, as described above, the crystal layer 104 is formed so that the lattice matches the nickel layer 102. On the other hand, when the material layer 103 is thicker than one atomic layer within a range in which lattice relaxation is not complete, the crystal layer 104 is in a state in which strain is applied.

When an electrode is formed on the upper surface of the mechanical vibrator formed in this manner, the material layer 103 on the back surface is used as another electrode, and according to an electric field between these two electrodes, vibration can be controlled. In addition, with these two electrodes, an electric field generated by vibration is detected, and operation as a sensor is possible. The frontside electrode may be produced before the vibrator shape part 106 is formed by etching or may be produced after the vibrator shape part 106 is formed. In addition, it is possible to modulate carriers generated in the crystal layer 104 due to vibration while the back-side electrode of the material layer 103 is operated as a back gate. In this case, when an electrode with ohmic connection to the crystal layer 104 is formed on the upper side, modulation of the carriers can be detected.

Here, a crystal made of cubic boron nitride or diamond is epitaxially grown on the crystal layer 104 to form another crystal layer (not shown) (fifth step), and a laminate structure including the material layer 103, the crystal layer 104, and the other crystal layer may be patterned to form a vibrator shape part.

As described above, for example, when iridium of 10 nm or less is epitaxially grown on a nickel single crystal (nickel layer) to form a material layer, it is possible to control lattice mismatch between diamond and cubic boron nitride which are epitaxially grown thereon. Therefore, hetero growth on the material layer made of high-quality diamond or cubic boron nitride (crystal) is possible.

The material layer may be in a state in which the in-plane lattice constant of the nickel layer therebelow is completely taken over, that is, compressive strain is completely applied, and the material layer may be partially lattice-relaxed by thickening the material layer. That is, it is possible to control the state of strain in the material layer according to the thickness of the material layer, and with this strain control, strain applied to the crystal layer that grows thereon can be controlled.

What is important here is that, when a crystal layer is epitaxially grown on the material layer, the material layer having a thickness sufficient to prevent a reaction between nickel and the grown crystal layer is formed. The thickness of the material layer may be one atomic layer as long as the material layer completely covers the entire nickel layer, but a triatomic material layer is industrially desirable. This also means preventing the nickel surface from being exposed due to partial defects but often means that the etching effect of the lower layer is not negligible in a process in which a crystal layer grows.

For example, when there is nickel on the surface on which diamond is grown, graphite is formed according to a catalytic action of the nickel. In addition, when there is nickel on the surface on which boron nitride is grown, hexagonal boron nitride is formed instead of a cubic crystal. Therefore, in growth of the crystal layer, the surface of the nickel layer made of nickel needs to be covered with a material layer made of a material composed of an element having no catalytic action. Regarding the material composed of the element having no catalytic action, platinum may be used in addition to the above iridium.

In this structure, in patterning of the crystal layer with diamond or cubic boron nitride, there is no need to tilt the substrate, and physical etching to a depth that reaches the nickel layer is possible using a mask according to FIB or RIE. In addition, although the etching rate of diamond or cubic boron nitride is slow, this problem can be solved by thickening the mask formed on the surface. The nickel layer can be easily selectively etched with hydrochloric acid or dilute nitric acid. Therefore, it is possible to produce a vibrator having a structure in which a vibrating part floats in midair, which is supported by a support, such as a cantilever beam structure, a double-supported beam structure, and a membrane structure with a crystal layer.

Here, in the vibrating part, a material layer made of thin iridium is formed on the crystal layer made of diamond or cubic boron nitride, and this material layer can be etched with hydrofluoric acid at high temperature. When the material layer is etched from the side (in the cross-sectional direction), the etching rate is very slow, but when it is etched from the front side, an etching process can be performed in a realistic processing time because the material layer is thin.

Even if a nickel layer made of single crystal nickel epitaxially grown on a substrate made of a semiconductor or a different type of single crystal metal is used, after processing is performed to reach the nickel layer, selective etching is performed as described above, and thus it is possible to easily produce a vibrator. Simply, the nickel layer may be sufficiently lattice-relaxed, and the in-plane lattice constant may be the original lattice constant of nickel. However, when lattice relaxation is intentionally left incomplete, the in-plane lattice constant of the outermost surface can be controlled. That is, when a substrate having a lattice constant larger than that of nickel is used, it is possible to control lattice mismatch with diamond or cubic boron nitride within a range in which the crystallinity is not impaired. Here, when the surface of the material layer made of iridium or platinum is completely lattice-relaxed, the lattice mismatch with the crystal layer becomes too large, and a crystal layer having favorable crystallinity cannot be formed. Therefore, it is important for the material layer to have a thickness in a range in which lattice relaxation is not complete and a maximum thickness is about 10 nm.

In this manner, when the iridium is epitaxially grown on the nickel layer in which the in-plane lattice constant is controlled to form a material layer, as described above, the layer may be completely strained or partially lattice-relaxed.

In the case of a single nickel layer or a nickel layer on a substrate made of a semiconductor or a different type of single crystal metal, as described above, the thickness of the material layer that is epitaxially grown on the nickel layer may be several layers in which lattice relaxation does not occur. Of course, like the nickel layer, a part of the material layer on the front side in the thickness direction is lattice-relaxed and thus lattice mismatch with the crystal layer made of diamond or cubic boron nitride can be controlled.

That is, when a residual strain amount of both the nickel layer and the material layer are controlled, the compressive strain or tensile strain can be applied to the crystal layer. In this manner, when strain is applied to the crystal layer, it is possible to control characteristics of the vibrator. Generally, when tensile strain is applied to the vibrating part, it is possible to obtain a vibrator that operates at a high frequency and has a high Q value (refer to Non Patent Literature 4).

In addition, on the crystal layer made of diamond or cubic boron nitride epitaxially grown on the nickel layer, a cubic boron nitride layer or a diamond layer (another crystal layer) can be formed mutually. In this case, it is possible to produce not only a single hetero structure including the diamond layer and the cubic boron nitride layer but also a superlattice in which a plurality of hetero structures are alternately laminated. In such a structure, after etching is performed to a depth that reaches the nickel layer, the nickel layer is selectively etched with hydrochloric acid or dilute nitric acid, and thus a vibrator can be produced.

When a hetero structure including the diamond layer (crystal layer) and the boron nitride layer (another crystal layer) described above or a diamond quantum well structure in which the diamond layer is interposed between both sides of boron nitride is produced, it is possible to construct an active element in which the nickel layer or the material layer is used as a back gate electrode and which can control conductivity. Regarding the orientation of the growth plane, such a structure can be applied to any plane without limitation to the (001) plane or the (111) plane, but when diamond is epitaxially grown, it is easier to use the (001) plane.

As described above, according to embodiments of the present invention, the material composed of the element having no catalytic action is epitaxially grown on the nickel layer to form a material layer and the cubic crystal is epitaxially grown thereon to form a crystal layer. Therefore, a mechanical vibrator is made of a cubic crystal such as diamond, and a high Q value is obtained. Examples of the element having no catalytic action include iridium and platinum, but the present invention is not limited thereto.

Here, the present invention is not limited to the embodiment described above, and it is apparent to those skilled in the art that many modifications and combinations can be realized in the scope and spirit of the present invention.

REFERENCE SIGNS LIST

101 Substrate
102 Nickel layer
102a Space
103 Material layer
104 Crystal layer
105 Mask pattern
105a Opening
106 Vibrator shape part

The invention claimed is:
1. A method of producing a mechanical vibrator, the method comprising:
a first step in which a material comprising an element having no catalytic action with respect to nickel is epitaxially grown on a nickel layer made of a nickel crystal to form a material layer;

a second step in which a cubic crystal is epitaxially grown on the material layer to form a crystal layer, wherein lattice constants in a plane direction are equal at an interface between the material layer and the crystal layer;

a third step in which a laminate structure including the material layer and the crystal layer is patterned to form a vibrator shape part, wherein the material layer and the crystal layer of the laminate structure are patterned in a same patterning step; and a fourth step in which the nickel layer below the vibrator shape part is removed to form a free-standing vibrator structure including the vibrator shape part, the vibrator shape part comprising the material layer and the crystal layer.

2. The method according to claim 1, wherein, in the first step, the material layer having a thickness of 10 nm or less is formed.

3. The method according to claim 1, wherein a crystal of the crystal layer is diamond or cubic boron nitride.

4. The method according to claim 1, wherein, in the second step, a crystal made of diamond or cubic boron nitride is epitaxially grown on the material layer to form the crystal layer.

5. The method according to claim 4, further comprising a fifth step in which a crystal made of cubic boron nitride or diamond is epitaxially grown on the crystal layer to form an additional crystal layer, and wherein, in the third step, the laminate structure including the material layer, the crystal layer, and the additional crystal layer is patterned to form the vibrator shape part.

6. The method according to claim 1, wherein the material is iridium or platinum.

7. The method according to claim 1, wherein the lattice constants in the plane direction are equal at an interface between the nickel layer and the material layer.

8. The method according to claim 1, wherein the lattice constant of a lower part of the material layer in the plane direction is different from the lattice constant of an upper part of the material layer in the plane direction.

9. The method according to claim 1, wherein the material layer becomes gradually lattice-relaxed at an upper part thereof.

10. The method according to claim 1, wherein prior to the first step, the nickel layer is heated to a first temperature in hydrogen or under a vacuum in an atmosphere of a hydrogen partial pressure of 5 Torr or more.

11. The method according to claim 10, wherein the first temperature is 1,000° C.

12. The method according to claim 1, wherein:
prior to the first step, the nickel layer is formed on an upper surface of a substrate; and
during the fourth step, the substrate is not removed such that, following the fourth step, the free-standing vibrator structure is suspended over a gap disposed directly between the upper surface of the substrate and a lower surface of the vibrator shape part.

13. The method according to claim 1, wherein, in the fourth step, the nickel layer is removed by wet etching of the nickel layer using the vibrator shape part as a mask.

14. A method of producing a mechanical vibrator, the method comprising:

forming a nickel layer made of a nickel crystal on an upper surface of a substrate;

epitaxially growing a material comprising an element having no catalytic action with respect to nickel on the nickel layer to form a material layer;

epitaxially growing a cubic crystal on the material layer to form a crystal layer, wherein lattice constants in a plane direction are equal at an interface between the material layer and the crystal layer;

patterning a laminate structure including the material layer and the crystal layer to form a vibrator shape part, wherein the material layer and the crystal layer of the laminate structure are patterned in a same patterning step; and removing the nickel layer below the vibrator shape part without removing the substrate to form a vibrator including the vibrator shape part over the upper surface of the substrate, wherein removing the nickel layer creates a gap between the upper surface of the substrate and the vibrator shape part, and wherein the vibrator shape part comprises the material layer and the crystal layer.

15. The method according to claim 14, wherein removing the nickel layer comprises performing a wet etching process using the vibrator shape part as a mask.

16. The method according to claim 14, wherein a crystal of the crystal layer is diamond or cubic boron nitride.

17. The method according to claim 14, wherein epitaxially growing the cubic crystal comprises epitaxially growing a crystal made of diamond or cubic boron nitride on the material layer to form the crystal layer.

18. The method according to claim 14, further comprising epitaxially growing a crystal made of cubic boron nitride or diamond on the crystal layer to form an additional crystal layer.

19. The method according to claim 18, wherein patterning the laminate structure comprises patterning the material layer, the crystal layer, and the additional crystal layer to form the vibrator shape part comprising the material layer, the crystal layer, and the additional crystal layer.

20. The method according to claim 14, wherein the material is iridium or platinum.

* * * * *